United States Patent [19]

Nicolau

[11] Patent Number: 4,581,218
[45] Date of Patent: Apr. 8, 1986

[54] PROCESS FOR THE PREPARATION OF HIGH PURITY ALPHA MERCURIC IODIDE FOR USE AS A STARTING MATERIAL SOURCE FOR THE GROWTH OF MONOCRYSTALS FOR NUCLEAR DETECTION

[75] Inventor: Yann F. Nicolau, St. Nazaire-les-Eymes, France

[73] Assignee: Commissariat a l'Energie Atomique, Paris, France

[21] Appl. No.: 580,529

[22] Filed: Feb. 15, 1984

[30] Foreign Application Priority Data

Feb. 28, 1983 [FR] France .................. 83 03262

[51] Int. Cl.$^4$ .......................................... C30B 29/12
[52] U.S. Cl. ...................................... 423/491; 203/91
[58] Field of Search .................. 423/491; 203/91; 156/507, 505

[56] References Cited

U.S. PATENT DOCUMENTS

| | | | |
|---|---|---|---|
| 3,969,182 | 7/1976 | Carlston | 156/621 |
| 4,091,084 | 5/1978 | Schieber | 423/491 |
| 4,347,230 | 8/1982 | Nicolau | 423/491 |

FOREIGN PATENT DOCUMENTS

| | | |
|---|---|---|
| 0022013 | 1/1981 | European Pat. Off. |
| 2665736 | 6/1978 | Fed. Rep. of Germany |
| 2316192 | 1/1977 | France |
| 2338742 | 8/1977 | France |
| 0121999 | 9/1980 | Japan .................... 423/491 |

OTHER PUBLICATIONS

M. Schieber et al., "Purification, Growth and Characterization of Alpha Mercuric-Iodide Crystals for Gamma-Ray Detection", Journal of Crystal Growth, 24/25, (1974) pp. 205-211.
Clara E. Miller, "The Effect of Mercuric Iodide and Ammonium Chloride on Glass", J. Physical Chemistry, (1931) pp. 2985-2992.
Muheim et al, "Spark Source Mass Spectrographic Analyses of $\alpha$-HgI$_2$: Comparison of Samples from Different Laboratories", Nuclear Instruments and Methods, 213 (1983) pp. 39-42.
Y. F. Nicolau, "Technology of High Purity HgI$_2$", Nucl. Instrum. Methods Phys. Res., 213(1), 13-18 (1983).
Y. F. Nicolau, "High-Purity Mercuric Iodide", J. Chem. Technol. Biotechnol., Chem. Technol., 33A(7), 350-60 (1983).
T. Kobagashi et al, "Mass Spectrographic Analysis and SEM Investigation of $\alpha$-HgI$_2$ Crystals Grown by Static Sublimation", Journal of Electrochemical Society, vol. 130, No. 5, (1983) pp. 1183-1191.
Journal of Applied Chemistry of the USSR, vol. 51, No. 3, part 1, Mar. 1976, Plenum Publishing Corporation, New York-G. G. Gospodinov: "Conditions for Production of High-Purity Mercury Diiodide", pp. 520-522.

Primary Examiner—Gary P. Straub
Assistant Examiner—Jackson Leeds
Attorney, Agent, or Firm—Pearne, Gordon, Sessions, McCoy, Granger & Tilberry

[57] ABSTRACT

The invention relates to a process for the preparation of high purity alpha mercuric iodide for use as a starting material source for the growth of monocrystals usable for nuclear detection.

This process consists of synthesizing alpha mercuric iodide and subjecting the thus obtained alpha mercuric iodide to a purification treatment consisting of at least one vacuum distillation stage at a temperature of at least 255° C.

For this distillation stage, use is made of a reactor having three zones kept at different temperatures. The iodide to be purified is introduced into the first zone kept at at least 255° C. The mercuric iodide vapors pass through the second zone kept at a higher temperature before being condensed in the air-cooled third zone.

16 Claims, 3 Drawing Figures

PROCESS FOR THE PREPARATION OF HIGH PURITY ALPHA MERCURIC IODIDE FOR USE AS A STARTING MATERIAL SOURCE FOR THE GROWTH OF MONOCRYSTALS FOR NUCLEAR DETECTION

BACKGROUND OF THE INVENTION

The present invention relates to a process for the preparation of high purity alpha mercuric iodide for use as a starting material source for the growth of alpha mercuric iodide monocrystals usable for the production of X and gamma radiation spectrometers and detectors operating at ambient temperature.

For the production of X and gamma radiation spectrophotometers and detectors, it is necessary to have high purity alpha mercuric iodide in order to bring about the growth of undeformed $\alpha$-$HgI_2$ monocrystals, which have a high degree of purity and a perfectly controlled stoichiometry. To obtain satisfactory performances, it is important to ensure that the monocrystals do not have trapping centres with deep levels in the forbidden band, because the charge carriers can be trapped by deep level centres. The latter are generally due to an error with respect to the stoichiometry of the monocrystal, to plastic deformations (dislocations) and to the inclusion of impurities produced during monocrystal growth.

A process for the production of $\alpha$-$HgI_2$ monocrystals is known, which makes it possible to both control the stoichiometry of the monocrystal and to minimize plastic deformations. This process, described in French patent application No. 7916418 of June 26th, 1979, uses as the starting substance alpha mercuric iodide polycrystals and a solution of $HgI_2$ in an organic sulphoxide and methanol, which has previously been purified by electrolysis.

Although this process leads to the obtaining of crystals with satisfactory properties, it is desirable to still further improve the properties of the monocrystals by using polycrystals having a high purity level for growth purposes, because in the polycrystals obtained by conventional synthesis processes, from elements having a high purity level, the content of impurities of a metallic, metalloid and organic nature is still too high.

A process for the purification of $\alpha$-$HgI_2$ is also known, which is intended to be used for the growth of high quality crystal. This process, described in French patent application No. 2,316,192 comprises a first stage of synthesizing the mercuric iodide from mercury and iodine, a second purification stage involving the repeated sublimation of the mercuric iodide prepared by synthesis and a third purification stage involving zone melting of the mercuric iodide purified by sublimation.

However, this process suffers from numerous disadvantages.

(a) It is impossible to obtain large quantities of $\alpha$-$HgI_2$ during dry synthesis, due to the risk of explosions and consequently the $\alpha$-$HgI_2$ quantities prepared by this process are limited to 100 g per charge.

(b) The large number of sublimation and zone melting stages gives rise to performance difficulties and gives a low efficiency level and yield. To obtain a high degree of purity, it is necessary to carry out 6 to 30 successive sublimations and 30 to 100 zone melting operations.

(c) The efficiency of impurity separation is low in the sublimation stage because, at the sublimation temperature between 100° and 140° C., most of the organic impurities form stable complexes with $\alpha$-$HgI_2$, which have a vapour pressure comparable to that of $\alpha$-$HgI_2$. Therefore, these complexes sublimate and condense at the same time as the $\alpha$-$HgI_2$. In the same way, the organic impurities only partly decompose at the temperature used for the sublimation. Thus, analyses by mass spectrometry have revealed that the alpha mercuric iodide monocrystals purified by repeated sublimations and obtained by vapour phase growth still contain at least 10 elements (C, N, O, Al, Ca, Mn, Na, K, Cr and Fe) and the organic impurities are broken down into 7 hydrocarbon radicals ($CH_3$, $C_2H_3$, $C_3H_3$, $C_3H_4$, $C_4H_4$, $C_4H_7$ and $C_4H_8$) at relatively high concentrations, because on average they exceed 50 to 100 ppm atomic for each element or hydrocarbon radical.

(d) The zone melting is difficult to carry out, due to the high vapour pressure of melted $HgI_2$, particularly as the $HgI_2$ purified by sublimation contains a large amount of organic impurities which crack and give carbon and tar suspensions which cannot be separated by zone melting and gaseous products which, by overpressures, may shatter the sealed tube containing the $HgI_2$ to be purified.

Another purification process is known consisting of a first stage of purification by recrystallization from a $\alpha$-$HgI_2$-saturated HCl solution (1:1) at approximately 100° C., a second stage of purification by "thermochemical" distillation (vacuum evaporation at approximately 200° C., superheating the $HgI_2$ vapour at 400° to 500° C. and condensation of the $\alpha$-$HgI_2$ at 40° to 50° C.) and a third purification stage by repeated sublimations at 120° to 130° C.

However, this process also has numerous disadvantages:

(a) the resulting product is polluted by chlorine, (b) the resulting product is non-stoichiometric (Hg rich), (c) the process requires 6 to 8 final sublimation cycles with a very low speed of 2 g/hour giving a total yield of 10 to 12%.

SUMMARY OF THE INVENTION

The object of the present invention is a process for the preparation of high purity alpha mercuric iodide, which obviates the disadvantages of the processes described hereinbefore and which makes it possible to eliminate impurities of all types (metallic, metalloid and organic) with a good efficiency or yield, whilst being suitable for use on an industrial scale.

The present invention therefore specifically relates to a process for the preparation of high purity alpha mercuric iodide, wherein it comprises:

(a) synthesizing alpha mercuric iodide, and (b) subjecting the thus obtained alpha mercuric iodide to a purification treatment consisting of at least one vacuum distillation stage at a temperature of at least 255° C., performed in a reactor having three successive zones kept at different temperatures and respectively constituted by a first zone kept at the triple point temperature of $\alpha$-$HgI_2$, i.e. 255° C. and into which is introduced the alpha mercuric iodide to be purified, a second zone kept at a temperature of 255° to 300° C. and a third zone kept at a lower temperature than those of the two other zones to carry out the condensation of the evaporated alpha mercuric iodide, said third zone being air cooled, whilst the reactor is kept under vacuum by means of a vacuum pump.

At the end of distillation, α-HgI$_2$ which has crystallized on the walls of the third zone of the reactor is collected. Generally, several distillation cycles are performed using for each cycle, the crystalline alpha mercuric iodide obtained by condensation in the preceding cycle. There are generally between 6 and 12 cycles.

By performing this vacuum distillation stage at a temperature of 255° C., it is possible to eliminate most of the impurities and simultaneously control the stoichiometric composition of the mercuric iodide.

Thus, most of the inorganic impurities present in the form of complexes with HgI$_2$ and which have a vapour pressure comparable to that of HgI$_2$, dissociate between 255° and 300° C. and their vapour pressure then drops well below that of HgI$_2$. Thus, these impurities remain in residue form in the bottom of the reactor and on its side wall. In the same way, the organic impurities decompose at this temperature and the gases such as H$_2$, H$_2$O, N$_2$, NH$_3$, CH$_4$, CO, CO$_2$, etc are pumped by the vacuum pump and the carbon or certain tars remain in the residue. Moreover, the distillation based on the difference between the partial pressures of the impurities and the HgI$_2$ is more effective than the sublimation based solely on the difference between the vapour pressures of the impurities and the HgI$_2$.

Thus, the distillation is very effective for eliminating in the residue:

Li, Na, K, Mg, Ca, Cr (II), Mn, Ni, Co, Ag, Ba and Pb, in the form of iodides,

Al and Si in the form of silicates,

B in the form of borate, P in the form of phosphate and As in the form of arsenate, Ti, Zr and V in the form of oxides.

In the same way, the distillation is effective for also separating in the residue Fe (III), Cu (I), Zn, Cd and Sn (II) in the form of iodide and S and Se respectively in the form of HgS and HgSe.

As phosphorus, boron and iodine are very volatile, they are condensed in the liquid nitrogen-cooled trap between the pump and the reactor, respectively in the form of PI$_3$, BI$_3$ and I$_2$.

Fluorine, chlorine and bromine in the form of mercury halides which are more volatile than HgI$_2$, partly condense in the trap. The same applies with regards to titanium, tin (IV) and mercury (I), which are in the form of iodides.

Distillation is less effective for the separation of Al, Si, Cr$^{III}$, As, V and Zr in the form of iodide, because the latter have vapour pressures comparable to HgI$_2$.

Thus, the process according to the invention is very efficient.

According to an advantageous feature of the process according to the invention, alpha mercuric iodide synthesis takes place by reacting mercury with iodine in an organic sulphoxide solution containing methanol.

This reaction is carried out at ambient temperature of approximately 20° C. in a quartz reactor for semiconductors. Use is made of mercury having a high purity, e.g. a purity of m7n and high purity iodine, e.g. with a purity of m5N5 dissolved in an organic sulphoxide solution having a spectrophotometric purity with methanol of electronic purity. In order to prevent heating of the solution, the water is cooled accompanied by stirring and mercury is progressively added until the iodine is used up. Preferably, the solution contains an iodine excess compared with the quantity necessary to obtain stoichiometric HgI$_2$.

Advantageously, the molar ratio [organic sulphoxide]/[sulphoxide]+[methanol] is 0.6 to 0.8 in the solution used for this synthesis.

Thus, at the end of the operation, a saturated HgI$_2$ solution is obtained and from this it is possible to recover HgI$_2$ by conventional processes, e.g. precipitation in water, in order to subsequently ensure its purification by distillation.

Although the synthesis described hereinbefore is preferred for obtaining a high degree of purity, it is also possible according to the invention to synthesize the alpha mercuric iodide by other processes, e.g. by synthesis in an aqueous solution, by a double exchange reaction, or by dry synthesis.

According to the invention, the product obtained then undergoes purification treatment consisting of at least one vacuum distillation stage.

Preferably, according to the invention, before carrying out this distillation stage, the alpha mercuric iodide undergoes an intermediate electrolytic purification stage dissolved in an organic sulphoxide and/or an intermediate alpha mercuric iodide recrystallization stage starting with a mercuric iodide solution in an organic sulphoxide.

The solutions used for electrolytic purification and for recrystallization contain methanol, like the solution used for synthesis. For electrolytic purification, the methanol addition is such that the molar ratio of [sulphoxide]/[sulphoxide]+[methanol] is 0.6 to 0.9. In addition, the electrolytic purification stage can be directly carried out on the saturated HgI$_2$ solution obtained during the synthesis in solution from mercury and iodine.

According to the invention, the electrolytic purification stage is carried out in such a way as to obtain a conductivity minimum of the solution of less than 100 $\mu$Scm$^{-1}$ at 20° C. This purification is advantageously carried out under the conditions given in French patent application No. 79/16.418, filed by the C.E.A. on June 26th, 1979.

According to a variant of the invention, it is possible to use for the electrolytic purification an alpha mercuric iodine solution prepared by dissolving the monocrystalline alpha mercuric iodide recovered by precipitation from the saturated HgI$_2$ solution obtained during synthesis in an organic sulphoxide and methanol. In this case, conductance water is added to the saturated solution in order toprecipitate the HgI$_2$. The precipitate is separated by filtration and is dried in vacuo, e.g. at 80° C., by using a quartz container for semiconductors.

Electrolysis is an efficient process for the purification of the HgI$_2$ by removing all its impurities electrolytically dissociated in solution. As the organic impurities from the iodine synthesis are not electrolytically dissociated, they cannot be separated by electrolysis.

In order to obtain a satisfactory degree of purity at the end of the electrolytic purification stage, there are preferably several cation separation cycles and several anion separation cycles, e.g. 8 to 24 cation separation cycles and 2 to 6 anion separation cycles. Following this electrolytic purification stage, α-HgI$_2$ is recovered by precipitation using water, as described hereinbefore.

This αHgI$_2$ then undergoes the vacuum distillation stage, preferably after subjecting it to an intermediate purification treatment by recrystallization from an organic sulphoxide solution containing methanol. The molar ratio of [sulphoxide]/[sulphoxide]+[methanol] is preferably 0.1 to 0.2. Recrystallization is generally carried out at between 65° and 15° C. In view of the fact that the increase in the solubility of $HgI_2$ in solution, as a function of the temperature, is limited, this recrystallization is performed in a reactor having two zones kept at different temperatures, namely a first dissolving zone heated to 60° to 65° C. and a second crystallization zone kept at a temperature below approximately 15° to 20° C. The reactor used can be a quartz reactor for semiconductors and which has a double wall. The bottom of the reactor contains the alpha mercuric iodide to be recrystallized and it is heated by water, whilst the upper side wall of the reactor is cooled with cold water. Thus, the $\alpha$-$HgI_2$ crystals dissolve on the bottom and crystallize on the side walls, forming a compact crust of polycrystals having an average size of 2 to 3 mm. Mass transfer naturally takes place by thermal convection.

Preferably, an iodine excess is added to the recrystallization solution in order to prevent reduction of $HgI_2$ into $Hg_2I_2$. Thus, the soluble impurity concentrated in solution is eliminated. However, it is more difficult to eliminate Cu, Ag Br and Cd. The same applies with regards to the heavy organic iodides resulting from the synthesis iodine (or $HgI_2$ starting substance). Several recrystallization cycles are generally performed in order to improve the degree of purity and the number of such cycles is generally 3 to 6.

According to the invention, the organic sulphoxides which can be used in the synthesis solution, the electrolysis purification solution and the recrystallizationpurification solution are dialkyl sulphoxides, such as dimethyl sulphoxide (DMSO), methyl ethyl sulphoxide, diethyl sulphoxide, tetramethylene sulphoxide, etc. In general, dimethyl sulphoxide is used.

BRIEF DESCRIPTION OF THE DRAWINGS

The invention is described in greater detail hereinafter relative to non-limitative embodiments and with reference to the attached drawings, wherein show.

DETAILED DESCRIPTION OF THE INVENTION

Figure 1:
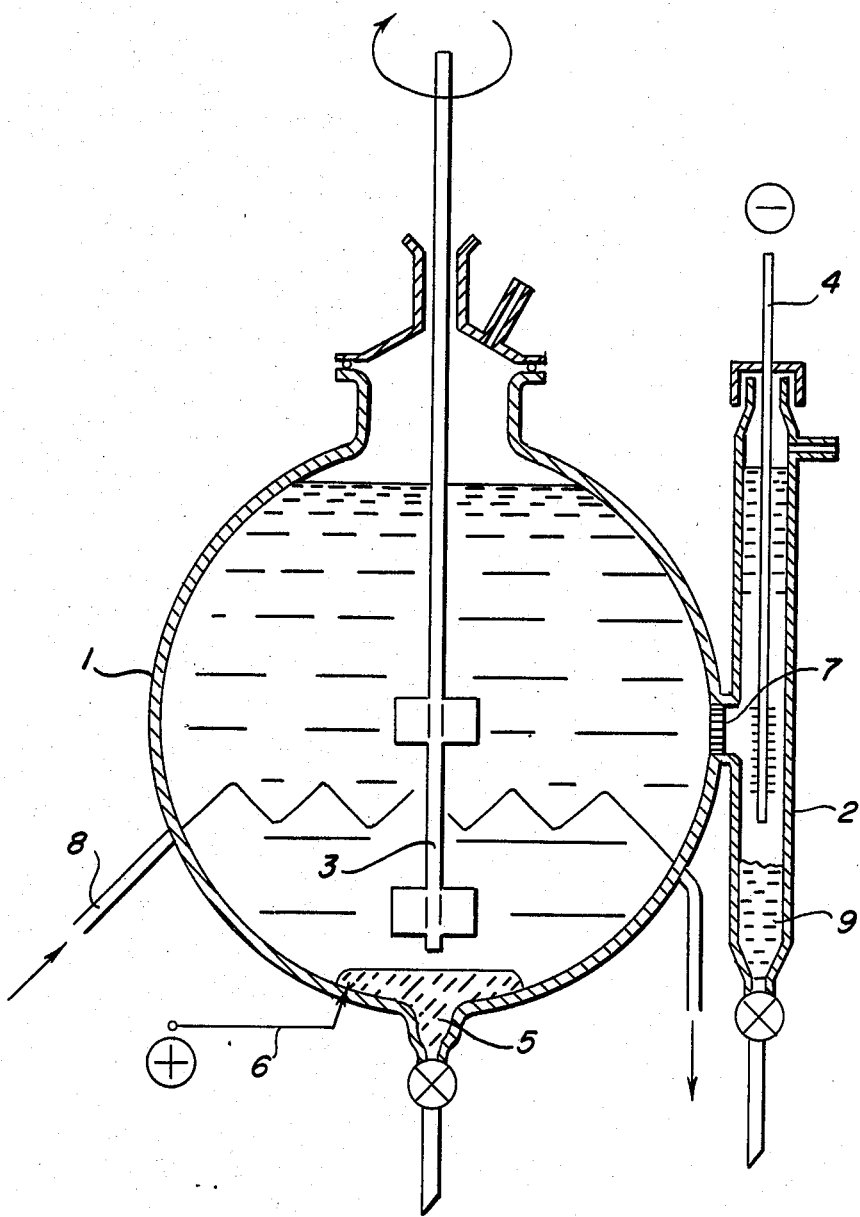
FIG. 1 diagrammatically, the apparatus used for electrolytic purification.

This example relates to obtaining high purity alpha mercuric iodine by performing the first synthesis stage in mercuric iodide solution and three purification stages, respectively constituted by the electrolytic purification of the alpha mercuric iodide solution in a sulphoxide, the recrystallization of $\alpha$-$HgI_2$ from a $HgI_2$ solution in an organic sulphoxide and vacuum distillation.

(a) $\alpha$-$HgI_2$ synthesis

The $\alpha$-$HgI_2$ synthesis is carried out in a 3 liter quartz reactor, equipped with an axial stirrer and a dropping funnel, which passes through the reactor seal or cap.

26.5 mol of (DMSO) for spectrophotometry (Aldrich product) diluted with 6.5 mol of electronic methanol (MeOH) are introduced into the reactor and this corresponds to a [DMSO]/[DMSO]+[MeOH] molar ratio of 0.8. 8 gram atoms of iodine with a purity of m5N5 are dissolved in the solution. 4 gram atoms of mercury having a purity of m7N are then progressively added, accompanied by stirring. The mercury reacts with the iodine at the bottom of the reactor to give $HgI_2$, which is dissolved in the solution. The reaction is stopped when one of the two elements is used up. A slight mercury excess is then added and the end of the reaction is indicated by the solution changing colour from brown to straw yellow. Then, once again, 8 gram atoms of iodine and 4 gram atoms of mercury are added and at the end of the reaction, a further 8 gram atoms of iodine and 4 gram atoms of mercury are added. After 24 hours, a solution is obtained which contains 12 mol of $HgI_2$.

In order to control or check the stoichiometry of the thus obtained $HgI_2$, at the end of the operation a slight iodine excess is added (0.5 to 1 g). The solution is then filtered on a filter having a quartz filter plate and a porosity of 4 in order to eliminate the traces of white impurities having a greasy appearance and which float on the surface (organic products).

It is possible to recover solid $\alpha$-$HgI_2$ from this solution, by precipitating it by adding 250 mol of conductance water. The precipitate easily sediments, is washed 6 times with 250 mol of conductance water, allowed to drip on a funnel having a quartz filter plate and is dried in the oven at 80° C. under a vacuum of 1350 Pa for 48 hours. Column 1 of the attached table indicates the impurity contents of the thus prepared alpha mercuric iodide.

(b) Purification by electrolysis

The alpha-$HgI_2$ crystals are redissolved in a solution of DMSO and MeOH for this purification stage. It is also possible to directly use the saturated mercuric iodide solution obtained at the end of this synthesis stage.

Purification is carried out in the apparatus shown in FIG. 1, which consists of a 10 liter, quartz spherical flask 1 constituting the anode space of the electrolyzer and a 100 ml volume quartz tube 2 constituting the cathode space of the electrolyzer. The anode compartment is provided with a quartz stirrer 3 and the cathode compartment is provided with a graphite cathode 4.

The anode of the anode compartment is constituted by a mercury excess 5 placed on the bottom of flask 1 and connected by a tungsten wire 6 to a direct current generator. The cathode space is linked with the anode space by means of a fritted quartz plate 7 forming the diaphragm. The mercuric iodide solution to be purified is introduced into the anode space and a voltage of 200 V is applied between the electrodes, whilst cooling the solution with cold water circulating in the quartz coil 8 traversing the spherical flask in order to limit the temperature to 20° C., said current varying between 20 and 100 mA.

Under these conditions, the electric current is carried by the iodomercurate anions $[HgI_2]^-$, the impurity cations and to a certain extent by the cation $[HgI]^+$. All these ions result either from the complexing of the impurity iodides by mercuric iodide according to a general reaction of the following type, e.g. in the case of sodium iodide:

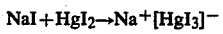

$$NaI + HgI_2 \rightarrow Na^+ [HgI_3]^-$$

or a certain autocomplexing of the mercuric iodide according to the reactions:

$$2\,HgI_2 \rightleftharpoons [HgI]^+ + [HgI_3]^-$$

At the anode, the iodomercurate anions discharge and supply iodine. To prevent iodine concentration, a high purity 7N mercury excess is placed at the bottom of the spherical flask and this reacts with the iodine, accompanied by the re-forming of mercuric iodide. The solution is diluted every so often in this case to prevent supersaturation.

At the cathode, the impurity cations are concentrated in the cathode space 2, e.g. $Na^+$, $K^+$, $Fe^{3+}$, $Ni^{2+}$, $Cu^{2+}$, $Cu^+$, $Cr^{3+}$, $Ca^{2+}$, $Ag^+$, etc. The $[HgI]^+$ cations discharge and deposit an insoluble mercurous iodine mud 9. Certain impurity cations are deposited at the same time as the mercurous iodide mud or are absorbed in the latter. The conductivity of the cathode space increases by 1 or even 2 orders of magnitude by the concentration of the ionized impurities. Space 2 is then emptied live and electrolysis is continued. The conductivity of the anode space progressively decreases as the result of the purification and remains stationary at 110 $\mu Scm^{-1}$ at 20° C., which is an approximate value because it is dependent not only on the autoionization of the actual mercuric iodide, but also on the presence of certain amounts of other ionized mercury salts accompanying the mercuric iodide as impurities, e.g. other halides, nitrate, sulphate, cyanide, etc.

Purification is continued until the conductivity of the cathode space no longer increases, or increases very slowly. The impurity cations are then removed from the solution and purity reaches m6-7N. A supplementary purification is carried out in order to also eliminate the impurity anions, the same procedure being adopted, but the polarity is reversed.

In order to obtain a good degree of purification, 24 purification cycles are carried out in this way in order to eliminate the cations and 6 purification cycles are carried out to eliminate the anions. In another example, there are 8 purification cycles for eliminating the cations and 2 purification cycles for eliminating the anions. It is pointed out that the term purification cycle is understood to mean the cycle corresponding to an electrolysis, followed by an emptying of compartment 2, both in the case of cation and anion elimination. In these examples, each cycle lasts approximately 7 days and at the end of each cycle 65 ml of impure solution is obtained by emptying the compartment 2.

Following these different electrolytic purification cycles, the mercuric iodide dissolved in the solution is precipitated by means of conductance water, as described hereinbefore. The impurity contents of the thus obtained $\alpha$-$HgI_2$ are given in the attached table (columns 2 and 3).

(c) $HgI_2$ recrystallization stage

Figure 2:
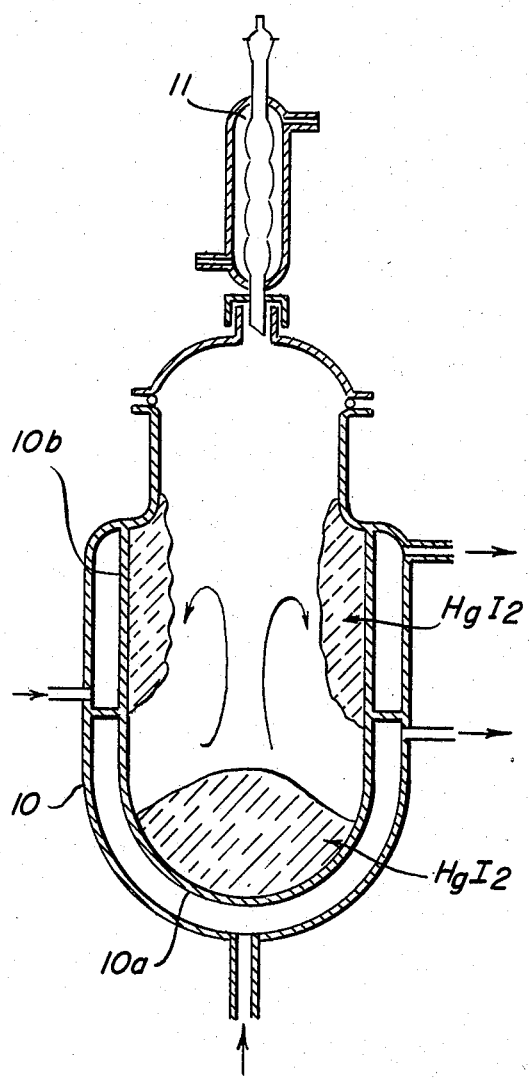
FIG. 2 the apparatus used for purification by recrystallization.

This stage is carried out by using the reactor shown in FIG. 2, which comprises a quartz container 10, equipped with a double wall designed in such a way that it can raise zones $10_a$ and $10_b$ of the reactors to different temperatures by water circulation. The upper part of the reactor is equipped with a reflex condenser 11. 10 mol of $\alpha$-$HgI_2$ obtained in (a) and 40 mol (1740 ml) of a DMSO and MeOH solution with a [DMSO]/[DMSO]+[MeOH] molar ratio of 0.1 are introduced into the reactor. The lower part $10a$ of the reactor is kept at a temperature of 65° C. by hot water circulation and in this way the $HgI_2$ crystals are dissolved in zone $10a$. The upper part $10_b$ of the reactor is kept at 15° C. by cold water circulation.

Thus, the $\alpha$-$HgI_2$ recrystallizes as a compact crust on the walls of reactor zone $10_b$ at the end of 5 days. The efficiency of the recrystallization cycle is approximately 95%. When this recrystallization is ended, the solution remaining in zone $10_a$ is removed and mercuric iodide recrystallized on the side walls of zone $10_b$ is recovered. These crystals are then again placed in the lower part of the reactor. A new DMSO/MeOH solution is then introduced and a further recrystallization cycle is performed. In this example, four recrystallization cycles are carried out. The impurity content of the thus purified $\alpha$-$HgI_2$ is indicated in column 4 of the attached table.

Following the final recrystallization cycle, the $\alpha$-$HgI_2$ crystals recovered on the side walls of reactor zone $10_b$ are dried in the oven at 80° C. under a vacuum of 1350 Pa, before undergoing the final stage of purification by vacuum distillation.

(d) Vacuum distillation stage

Figure 3:
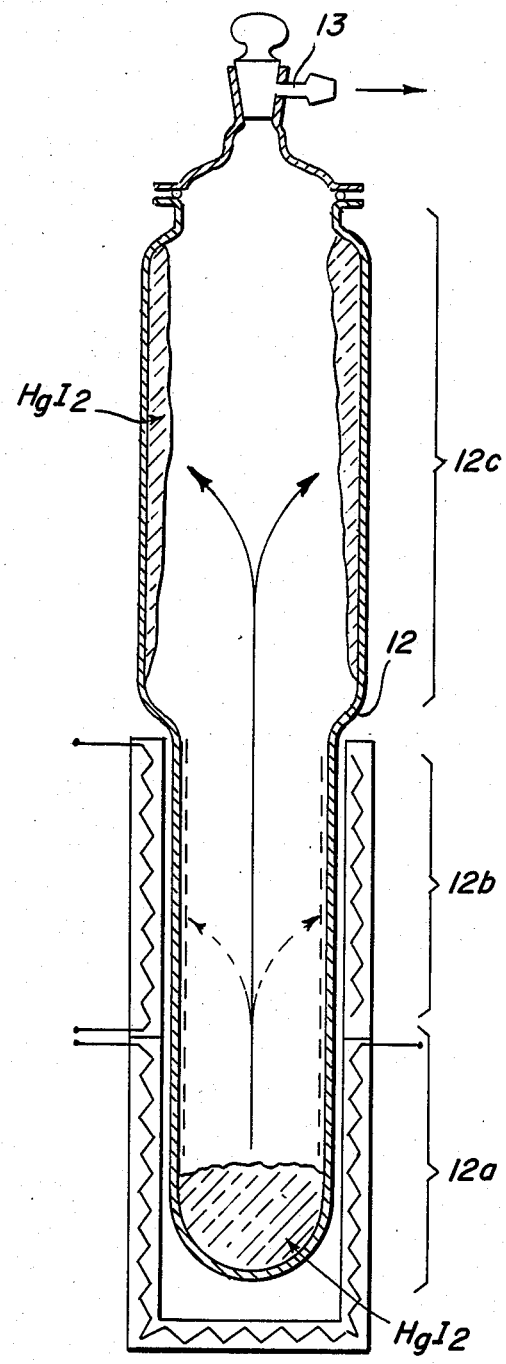
FIG. 3 diagrammatically, the reactor used for the purification by vacuum distillation of $HgI_2$.

This stage is carried out by using the apparatus shown in FIG. 3, which comprises a 3 liter quartz reactor 12 having three successive zones $12a$, $12b$ and $12c$. Zone $12a$ located in the lower part of the reactor can be raised to a temperature of 255° C. by electrical heating. Zone $12b$ is kept at a temperature of 300° C. by electrical heating and the third zone $12c$ is air cooled by natural convection. The vacuum is produced in the reactor by means of a vacuum pump connected to the upper part 13.

5 kg of $\alpha$-$HgI_2$ are introduced in zone $12a$ into the bottom of the reactor and a vacuum of $10^{-4}$ Pa is formed under continuous pumping. The crystals are melted and distillation takes place at 255° C. The $HgI_2$ vapour condenses on the walls of the upper zone $12c$, where $\alpha$-$HgI_2$ crystals are formed. Distillation lasts approximately 4 hours. As soon as this distillation is at an end, the layer of decrystallized crystals on the walls of zone $12c$ is removed and then placed on the bottom of the reactor to carry out a second distillation cycle, after removing the residue of the first distillation cycle remaining on the bottom of the reactor and on the walls of intermediate zone $12b$. The efficiency of each distillation cycle is approximately 99% and approximately 12 distillation purification cycles are performed.

The attached table gives the impurity contents of the $\alpha$-$HgI_2$ obtained after 12 distillation purification cycles.

The list of elements considered represents all the impurities contained in the $\alpha$-$HgI_2$, with the exception of C, O, N and H, which cannot be quantified by the type of analysis used (see table).

On the basis of the results given in the table, it can be seen that each state of the process is very effective in reducing the content of impurities in the alpha mercuric iodide.

Thus, the total impurity content of the alpha mercuric iodide obtained by synthesis in solution was 376 ppm and this is reduced (a) to 83 ppm after 10 purification cycles by electrolysis and to 19 ppm after 30 purification cycles by electrolysis, (b) to 53 ppm after 4 purification cycles by recrystallization, and (c) to 9 ppm after 12 distillation cycles.

Of the impurities which could not be quantified by mass spectrometry, by far the most abundant was C. The C content of synthesis $\alpha$-$HgI_2$ crystals is approximately 500 ppm. It drops to approximately 200 ppm after 4 recrystallization cycles and is only a few ppm after 12 distillation cycles.

When the different stages of the process are performed successively, it is possible to obtained after 10 electrolysis cycles, 4 recrystallization cycles and 12 vacuum distillation cycles, an α-HgI$_2$ impurity content below 1 ppm.

The purification process according to the invention is able to eliminate all the impurities of α-HgI$_2$ by the combination of the three aforementioned purification stages. Thus, the organic impurities are not eliminated by electrolysis, but are eliminated by recrystallization and distillation. Cu, Ag, Br and Cd are not effectively eliminated by recrystallization, but are eliminated by electrolysis and distillation. Al, Si, Cr$^{III}$, As, V and Zr are not effectively eliminated by distillation, but are eliminated by electrolysis and recrystallization.

The purified α-HgI$_2$ crystals obtained by the process according to the invention are kept in quartz, polyethylene or Teflon bottles under an inert gas atmosphere.

These crystals can be used as a starting material source having satisfactory purity and stoichiometry levels in order to obtain alpha mercuric iodide monocrystals by growing in solution or in vapour phase and which comply with the quality requirements imposed by nuclear detection.

TABLE

| Impurities* | After a | After a + b 1 | After a + b 2 | After a + c | After a + d |
|---|---|---|---|---|---|
| Li | 0.4 | 0.1 | — | — | — |
| D | 1 | 0.3 | 0.1 | 0.05 | 0.03 |
| F | 1 | 1 | — | 0.5 | — |
| Na | 20 | 5 | 0.2 | 0.5 | 0.25 |
| Mg | 8 | 2 | 0.3 | 2 | 0.25 |
| Al | 7 | 3.5 | 0.4 | 5 | 2.65 |
| Si | 30 | 14 | <1 | 3 | 0.90 |
| P | 3 | 0.5 | <0.1 | 1 | 0.05 |
| S | 20 | 4 | — | ≦2 | 1.05 |
| Cl | 124 | 4 | 0.1 | 3 | 0.10 |
| K | 37 | 9 | 0.6 | 20 | 0.85 |
| Ca | 30 | 11 | 0.5 | 3 | 0.75 |
| Ti | 10 | 1 | <0.3 | 1 | <0.20 |
| V | <0.1 | <0.1 | <0.1 | — | <0.05 |
| Cr | 26 | 4 | 3 | 1 | 0.25 |
| Mn | 0.5 | 0.5 | 0.5 | 0.1 | 0.05 |
| Fe | 25 | 8 | 7 | 6 | 0.60 |
| Ni | 13 | 10 | 3 | 0.3 | 0.40 |
| Co | 0.4 | 0.5 | — | 0.2 | — |
| Cu | 2 | 2 | 1 | 1 | 0.15 |
| Zn | 11 | 2 | 0.5 | ≦0.1 | — |
| As | 0.4 | — | — | 0.1 | — |
| Cr | 0.3 | — | — | 0.1 | — |
| Zr | 2 | — | — | 0.7 | — |
| Ag | 1 | 0.2 | — | 0.7 | — |
| Cd | <2.5 | — | — | <2 | — |
| Sn | <0.5 | — | — | — | — |
| Ba | — | — | — | — | — |
| Total | 376 | 83 | 19 | 53 | 9 |

1: 8 cation purification cycles and 2 anion purification cycles.
2: 24 cation purification cycles and 6 anion purification cycles.
*The results are expressed in parts per million of mass (ppm) and were obtained by mass spectrometry.

What is claimed is:

1. A process for the preparation of high purity alpha mercuric iodide, wherein it comprises: (a) synthesizing alpha mercuric iodide, and (b) subjecting the thus obtained alpha mercuric iodide to a purification treatment comprising at least one vacuum distillation stage at a temperature of at least 255° C., performed in a reactor having three successive zones kept at different temperatures and respectively constituted by a first zone kept at the triple point temperature of α-HgI$_2$, 255° C., and into which is introduced the alpha mercuric iodide to be purified, a second zone kept at a temperature which is higher than that in said first zone and which is in the range of from about 255° to about 300° C. and a third zone kept at a lower temperature than those of the two other zones to carry out the condensation of the evaporated alpha mercuric iodide, said third zone being air cooled, whilst the reactor is kept under vacuum by means of a vacuum pump.

2. A process according to claim 1, wherein alpha mercuric iodide synthesis takes place by reacting mercury with iodine in an organic sulphoxide solution containing methanol.

3. A process according to claim 2, wherein the organic sulphoxide—methanol solution contains an iodine excess.

4. A process according to claim 2, wherein the molar ratio of [sulphoxide]/[sulphoxide]+[methanol] is 0.6 to 0.8.

5. A process according to claims 2 or 3, wherein the organic sulphoxide is dimethyl sulphoxide.

6. A process according to claim 1, wherein the purification treatment comprises a first stage of electrolytic purification of the alpha mercuric iodide dissolved in organic sulphoxide followed by said at least one vacuum distillation stage.

7. A process according to claim 1, wherein the purification treatment of the alpha mercuric iodide comprises a first stage of recrystallizing the alpha mercuric iodide from a mercuric iodide solution in an organic sulphoxide followed by said at least one vacuum distillation stage.

8. A process according to claim 1, wherein the purification treatment of the alpha mercuric iodide comprises a first stage of electrolytic purification of the mercuric iodide dissolved in an organic sulphoxide, a second stage of recrystallizing the alpha mercuric iodide purified in this way from a solution of said mercuric iodide in an organic sulphoxide followed by said at least one vacuum distillation stage.

9. A process according to either of the claims 6 and 8, wherein the alpha mercuric iodide solution used for the first electrolysis purification stage contains methanol.

10. A process according to claim 9, wherein the [sulphoxide]/[sulphoxide]+[methanol] molar ratio is 0.6 to 0.9 in the mercuric iodide solution used for purification by electrolysis.

11. A process according to either of the claims 7 and 8, wherein the alpha mercuric iodide solution used for the recrystallization stage contains methanol.

12. A process according to claim 11, wherein the [sulphoxide]/[sulphoxide]+[methanol] molar ratio is 0.1 to 0.2 in the mercuric iodide solution used for the recrystallization stage.

13. A process according to claims 7 or 8, wherein the alpha mercuric iodide solution used for the recrystallization contains an iodide excess.

14. A process according to claims 7 or 8, wherein recrystallization is carried out in a reactor having two zones kept at different temperatures, namely a first dissolving zone heated to a temperature of 60° to 65° C. and a second crystallization zone kept at a temperature below 20° C.

15. A process according to any one of the claims 6 to 8, wherein the organic sulphoxide is dimethyl sulphoxide.

16. A process according to either of the claims 7 and 8, wherein the electrolytic purification is performed by means of a mercury anode and a graphite cathode.

* * * * *